US008349115B2

(12) United States Patent
Park et al.

(10) Patent No.: US 8,349,115 B2
(45) Date of Patent: Jan. 8, 2013

(54) METHOD FOR FABRICATION OF PATTERNED MICRO/NANO ARCHITECTURES USING DIRECTIONAL PHOTO-FLUIDIZATION OF POLYMER

(75) Inventors: Jung-Ki Park, Daejeon (KR); Seungwoo Lee, Daejeon (KR); Jihye Lee, Daejeon (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 364 days.

(21) Appl. No.: 12/813,435

(22) Filed: Jun. 10, 2010

(65) Prior Publication Data

US 2011/0143098 A1 Jun. 16, 2011

(30) Foreign Application Priority Data

Dec. 15, 2009 (KR) .............................. 2009-0124842

(51) Int. Cl.
*B32B 38/00* (2006.01)

(52) U.S. Cl. ...................................... 156/245; 428/172

(58) Field of Classification Search .................. 156/245, 156/272.2; 428/172
See application file for complete search history.

(56) References Cited

U.S. PATENT DOCUMENTS

2007/0105972 A1* 5/2007 Doyle et al. ...................... 522/1

OTHER PUBLICATIONS

Ohno et al., "Observation of geometrical resonance in optical throughput of very small aperture lasers associated with surface plasmons," J. of Appl. Phys., vol. 101, pp. 083107-1 to 083107-4 (2007).
Rechberger et al., "Optical Properties of Two Interacting Gold Nanoparticles," Optics Comm., vol. 220, pp. 137-141 (2003).
Haynes et al., "Nanosphere Lithography: A Versatile Nanofabrication Tool for Studies of Size-Dependent Nanoparticle Optics," J. Phys. Chem. B, vol. 105, pp. 5599-5611 (2001).
Henzie et al., "Multiscale Patterning of Plasmonic Metamaterials," Nature Nanotechnology, vol. 2, pp. 549-554 (2007).
Xu et al., "Surface Plasmon Resonances of Free-Standing Gold Nanowires Fabricated by Nanoskiving," Angew. Chem. Intl. Ed., vol. 45, pp. 3631-3635 (2006).

* cited by examiner

*Primary Examiner* — Daniel McNally
(74) *Attorney, Agent, or Firm* — Baker & Hostetler LLP (57) ABSTRACT

Disclosed is a method for fabrication of a patterned micro-architectural array by directional photo-fluidization of a polymer, which includes a process for formation of a micro-architectural array, the method comprising preparing a micro-fluidic device by bonding a rubber mold having a micro-pattern to a substrate, introducing a polymer solution to the micro-fluidic device, drying the polymer to form a polymer line array corresponding to a pattern of a micro-fluidic tube, inducing directional photo-fluidization by light radiation to control shape and size of the micro-architectural array, and applying metal to the polymer array having controlled structure by directional photo-fluidization then selectively removing the polymer, in order to transfer the shape of the polymer onto the micro-architectural array. Precisely controlled and various micro-architectures having different sizes as well as regular alignment shapes may be fabricated in large scale and parallel mode by transferring the foregoing controlled template onto the architecture.

7 Claims, 9 Drawing Sheets

METHOD FOR FABRICATION OF PATTERNED MICRO/NANO ARCHITECTURES USING DIRECTIONAL PHOTO-FLUIDIZATION OF POLYMER

CROSS-REFERENCE TO RELATED APPLICATIONS

This application claims priority to foreign Patent Application KR 2009-0124842, filed on Dec. 15, 2009, the disclosure of which is incorporated herein by reference in its entirety.

FIELD OF THE INVENTION

The present invention relates to a method for fabrication of a micro/nano scale micro-architectural array using a polymer array with directional fluidization as a template, in turn controlling morphology and size of the architectural array and, more particularly, to a method for fabrication of a microfine architecture having controlled size and regular alignment shapes in large scale and parallel mode, which includes precision regulation of shape and size of a polymer array template based on characteristics thereof such as fluidizing orientation determined by polarization, fluidized modification of the polymer array varied over light radiation time, etc., and, in addition, pattern transfer of such processed template.

BACKGROUND OF THE INVENTION

With regard to fabrication of a micro-architecture to which the present invention pertains, some characteristics such as determination of fluidizing orientation and fluidized modification varied over light radiation time are applied to precision control of morphology and size of a polymer array template and such controlled template is subjected to pattern transfer, so as to manufacture a micro-architecture having controlled size and regular alignment shape in large scale and parallel mode.

In general, a micro/nano scale fine architecture shows different optical and/or electrical properties independent of typical structures. For instance, for a metal micro-architecture, light waves are actively excited and considerably amplified on a surface of the metal micro-architecture by radiation. Such light wave amplification of the metal micro-architecture generally refers to plasmonic phenomenon. The plasmonic phenomenon derives light collection and/or light amplification in a small scale overcoming diffraction limit. Therefore, such plasmonic phenomenon may be preferably utilized for manufacture of quantum optic devices and micro optical devices such as a microscale sensor. A wavelength of amplified light wave appears in a scale two times larger than a size of a metal micro-architecture and shows dependency on morphology of the architecture. Accordingly, controlling morphology and size of a micro-architecture may accomplish control of characteristics of micro-optical devices.

As a result of considerable research and investigation, techniques for fabrication of micro architectures having controlled shape and size have been suggested. Examples of conventional methods may include direct-writing and pattern transfer of template. The direct-writing is a method of radiating a focused-ion beam (FIB) or electron-beam on a polymer film and conducting removal thereof. Therefore, a pattern may be formed on the removed part.

The direct-writing has an advantage of precisely controlling morphology and size of a micro-architecture. In general, individual micro-architectures should be directly patterned, thus requiring extended processing time and high cost. On the other hand, the pattern transfer method using a template is a method for transferring a polymer template having colloidal particle arrangement or holographic interference pattern.

The pattern transfer of template relates to pattern transfer onto a micro-architecture using a pre-formed template in large scale and parallel mode, having advantages of reduced processing cost and time. However, the temperate is substantially a polymer template having colloidal particles and holographic interference pattern and entails restriction in morphology such as a circle or line. Furthermore, a process of slicing an epoxy resin containing a metal film by an ultramicrotoming technique and transferring the sliced resin onto a substrate is known. The size and shape of the fabricated architecture may be controlled using the foregoing process. However, the above process has a drawback of using ultramicrotoming as a micro-processing technique to which general users are limited to approach.

SUMMARY OF THE INVENTION

Embodiments of the present invention advantageously solve conventional problems described above and provide methods for fabrication of a micro-architectural array, including precisely regulating shape and size of a polymer array by directional photo-fluidization occurring when a polymer containing azo-benzene molecules are irradiated, and using the polymer array having regulated shape and size as a template to produce the architectural array. Briefly, one aspect of the present invention controls the optical properties of a micro-architecture by precisely regulating shape and size of the micro-architecture by application of directional photo-fluidization.

Another aspect of the present invention provides a process for mass-production of micro-architectures having a regular alignment thereof by regulating shape and size of each micro-architecture in large scale and parallel mode.

In order to accomplish the above, an embodiment of the present invention provides a method for fabrication of a microfine architecture having controlled size and regular alignment shapes in large scale and parallel mode, which includes precision regulation of shape and size of a polymer array template based on characteristics thereof such as fluidizing orientation determined by polarization, fluidized modification of the polymer array varied over light radiation time, etc., and pattern transfer of such processed template.

In addition, one embodiment of the present invention provides a method for fabrication of a patterned micro-architectural array by directional photo-fluidization of a polymer, which includes a process for formation of a micro-architectural array, the method comprising preparing a micro-fluidic device by bonding a rubber mold having a micro-pattern to a substrate, introducing a polymer solution to the micro-fluidic device, drying the polymer to form a polymer line array corresponding to a pattern of a micro-fluidic tube, inducing directional photo-fluidization by light radiation to control shape and size of the micro-architectural array, and applying metal to the polymer array having controlled structure by directional photo-fluidization then selectively removing the polymer, in order to transfer the shape of the polymer onto the micro-architectural array.

According to one aspect of the present invention, regulating shape and size of a polymer array may enable control of optical properties of a micro-architecture and mass production of micro-architectures having regular alignments by regulating the shape and size of each micro-architecture in large scale and parallel mode.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

The invention will now be described with reference to the drawing figures, in which like reference numerals refer to like parts throughout.

Embodiments of the present invention provide a method for fabrication of a patterned micro-architecture by directional photo-fluidization of a polymer.

One embodiment of the present invention provides a method for fabrication of a patterned micro-architectural array by directional photo-fluidization of a polymer, which includes a process for formation of a micro-architectural array, the method comprising preparing a micro-fluidic device by bonding a rubber mold having a micro-pattern to a substrate, introducing a polymer solution to the micro-fluidic device, drying the polymer to form a polymer line array corresponding to a pattern of a micro-fluidic tube, inducing directional photo-fluidization by light radiation to control shape and size of the micro-architecture array, and applying metal to the polymer array having controlled structure by directional photo-fluidization then selectively removing the polymer, in order to enable transfer of the shape of the polymer onto the micro-architectural array.

According to one aspect of the present invention, the polymer may be a polymer having an azo-benzene molecule-containing linear structure, a composition including the polymer or a derivative of the polymer.

According to one embodiment of the present invention, the array may be a linear or ellipsoidal array pattern formed by directional fluidization of the polymer.

According to one embodiment of the present invention, orientation and extent of directional fluidization may be controlled using a polarizing direction and a light radiation time.

According to one embodiment of the present invention, the directional fluidization of the polymer may be partially induced by irradiation of a one-dimensional holographic interference pattern and used to form an ellipsoidal array pattern.

According to one embodiment of the present invention, metal may be applied to the polymer using the polymer linear pattern array that has a controlled structure formed by directional fluidization and the polymer is selectively removed to enable pattern transfer onto a micro-architecture.

According to one embodiment of the present invention, metal may be applied to the polymer using the polymer ellipsodial pattern array that has a controlled structure formed by directional fluidization and the polymer is selectively removed to enable pattern transfer onto a micro-architecture.

One embodiment of the present invention also provides a patterned micro-architecture fabricated by the foregoing method.

Hereinafter, embodiments of the present invention will be described in detail.

According to a preferred embodiment of the present invention, a process for formation of a micro-architecture having precisely controlled size and shape may include introducing a polymer solution into a micro-fluidic device prepared by bonding a rubber mold to a substrate, thus injecting the polymer solution into the micro-fluidic device via capillary action. Then, completely drying a solvent in the polymer solution, a polymer line array corresponding to a shape of a micro-fluidic tube is fabricated. Here, light radiation on the polymer array may induce directional photo-fluidization of the polymer, in turn modifying a unit into desired shapes and sizes in large scale and parallel mode. Afterward, metal is applied to the modified polymer array and the polymer is removed. The polymer substantially functions as a mask and a shape of the polymer removed from the array may be transferred onto a micro-architectural array.

In this regard, the substrate may comprise a hard plate made of glass, silicon wafer, quartz, etc. Alternatively, the substrate may comprise a soft polymer film plate with flexible properties.

The polymer used herein may include a polymer containing azo-benzene molecules.

The polymer pattern may be formed by mechanical injection using a dispenser or by inkjet printing.

A size of the architecture in the polymer array may range from several nanometers to several hundred micrometers while a height of a polymer pattern may range from several nanometers to several tens of micrometers.

An overall area of the polymer array formed herein may range from several micrometers to several centimeters.

The directional photo-fluidization of the polymer array may be induced by far-field and/or near-field light radiation.

The emitted light for inducing the directional photo-fluidization of the polymer array may have the entirety of wavelength area at which azo-benzene molecules absorb the light.

Orientation of the directional fluidization may be controlled by a polarizing direction of the light.

An extent of the directional fluidization may be regulated by light radiation time and/or light intensity.

Patterned light such as a holographic interference pattern may be used in a region on which the directional fluidization occurs.

One embodiment of the present invention describes a method for fabrication of a micro-architectural array including applying metal to a polymer array having controlled shape and size by directional fluidization, and selectively removing a polymer part to enable pattern transfer onto a micro-architecture.

The metal application may be conducted by electron beam evaporation or thermal evaporation.

In order to improve contact characteristics of the metal to a substrate, chromium or titanium may be used.

The polymer part may be removed using a solvent to dissolve the polymer and separate the same from the array. Alternatively, the polymer part may be removed by plasma or ion treatment.

According to one aspect of the present invention, a polymer array having directional fluidization properties may be used to precisely regulate shape and size of a micro-architecture. In particular, since the shape and size of the micro-architecture is regulated in a large scale and parallel process, the present invention is preferable for mass-production of such micro-architectures. Moreover, the micro-architecture having precisely regulated shape and size may also exhibit precisely controlled nano-optical properties such as plasmonic phenomenon, thus being used as a micro-optical device in various applications.

Hereinafter, the following detailed description will be given of technical configurations of the present invention.

Figure 1:
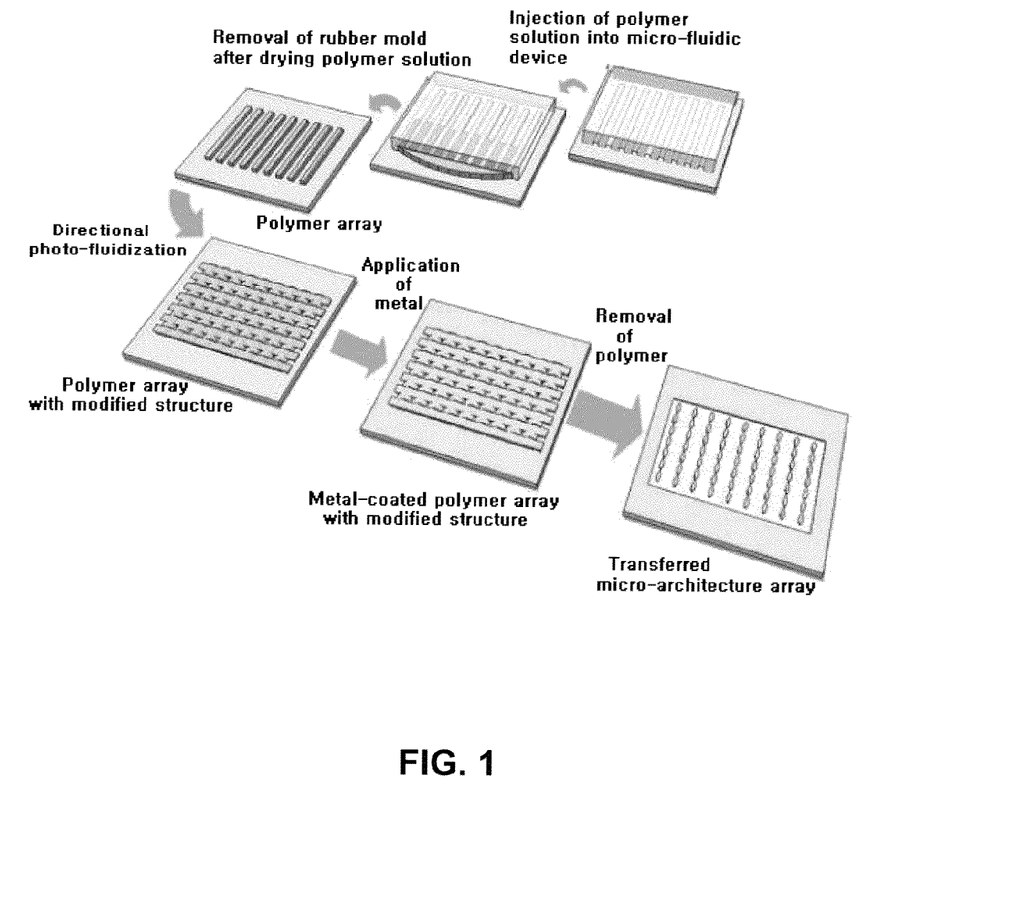
FIG. 1 is a schematic view illustrating a process of fabricating a micro-architectural array according to the present invention.

A method for fabrication of a micro-architectural array having different shapes and sizes according to one embodiment of the present invention comprises: (a) a step of bonding a rubber mold having a micro-pattern to a substrate to prepare a micro-fluidic device, injecting a polymer solution into the micro-fluidic device, drying the polymer to form a polymer line array corresponding to a pattern of a micro-fluidic tube, and inducing directional photo-fluidization of the polymer array by light radiation to control shape and size of the micro-architectural array; and (b) a step of applying metal to a polymer having controlled structure by directional photo-fluidization and selectively removing a polymer part to enable pattern transfer onto the micro-architectural array (see FIG. 1).

Control of Shape and Size of Micro-Architectural Array

In step (a), the rubber mold may be configured using a cross-linked polymer having a cross-linked polydimethylsiloxane and acrylate group and, preferably, may comprise polymethylsiloxane. The polymer used herein is not particularly limited so long as the polymer contains azo-benzene molecules and has a linear type polymer structure. A concentration of the polymer solution may range from 0.01 to 10 wt. % and, preferably, 1 to 2 wt. %.

Fabrication of Micro-Architectural Array Having Different Shapes and Sizes

In step (b), light radiation may be executed in an intensity of 10 mW/cm$^2$ to 100 mW/cm$^2$ and, preferably, 30 to 40 m/cm$^2$. Since the directional fluidization of the polymer generally occurs in a direction parallel to a light polarizing direction, all polarization including circular polarization and/or linear polarization may be used. A wavelength of the light used herein is not particularly limited if the azo-benzene molecule absorbs light at the wavelength. The metal applied to the polymer may be selected from all metals, although gold is preferably used in the present invention. Metal application is generally conducted by electron beam evaporation or thermal evaporation and, preferably, electron beam evaporation is used in the present invention. However, a method for metal application is not particularly limited. Further, the present invention uses a solvent to dissolve a polymer in order to remove the polymer. However, any conventional method may be used to remove the polymer.

For a metal micro-architecture formed in step (b), it can be found that light at a specific wavelength band is amplified on a surface of the metal micro-architecture while light radiating. Since a wavelength of such amplified light is proportional to the size of the micro-architecture, the wavelength of the amplified light may be controlled by regulating the size of the micro-architecture.

The following examples will be given of illustrating preferred embodiments of the present invention. However, such embodiments are provided for illustrative purposes but are not construed to restrict the scope of the present invention as defined by the appended claims.

Example 1

Preparation of Polymer Array

Using photolithography, a line pattern is first formed on a silicon material. Next, a polydimethylsiloxane precursor is poured on the silicon material, followed by thermal hardening to prepare a rubber mold. A polydimethylsiloxane line pattern of the prepared rubber mold has a period of 3.84 μm and a width of each line is 1.30 μm. The prepared polydimethylsiloxane mold is bonded to a quartz plate to form a micro-fluidic device. By poly-condensation of disperse orange 3 (DO 3) and bisphenol A diglycidylether molecules, polydisperse orange 3 (PDO 3) is obtained (molecular weight: 4700 wt, PDI=1.74). PDO 3 is dissolved in a methyl pyrrolidone solvent to prepare 1.0 wt. % polymer solution. Continuously, such PDO 3 solution is injected into an inlet of the micro-fluidic device and fills micro-fluidic device lines, followed by drying the micro-fluidic device at room temperature for two days. Afterward, PDO 3 line type pattern is obtained by removing the polydimethylsiloxane rubber mold. An overall area of the PDO 3 line type pattern is about 3.3 mm2.

Figure 2:
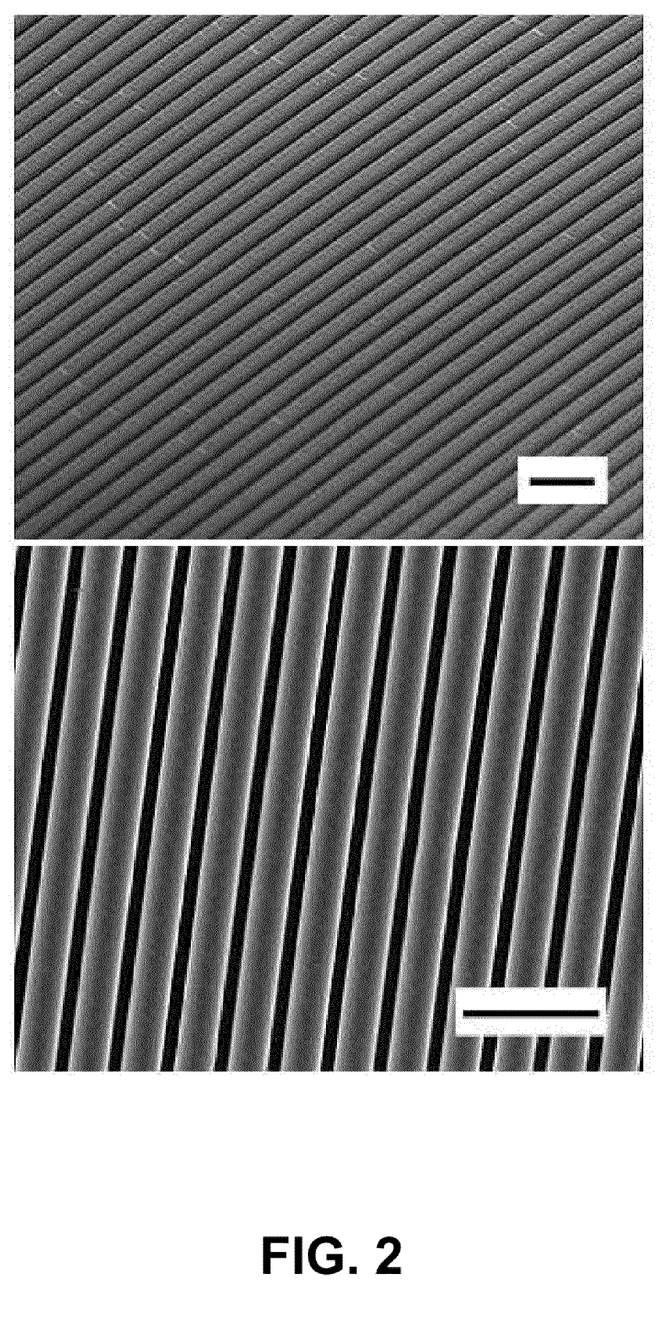
FIG. 2 is scanning electron microscope (SEM) photographs showing a polydimethylsiloxane rubber mold prepared according to the present invention, wherein scale bars indicate 10 μm.
Figure 3:
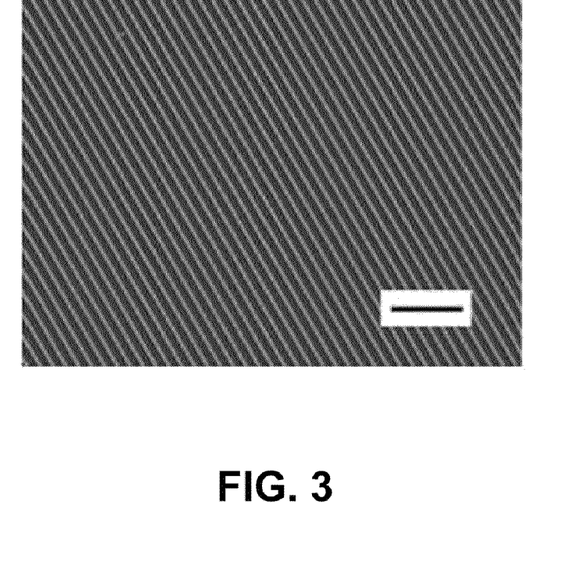
FIG. 3 is an SEM photograph showing a polydisperse orange (PDO) 3 line pattern formed according to the present invention, wherein a scale bar indicates 2.5 μm.

FIG. 2 is SEM photographs showing the polydimethylsiloxane rubber mold prepared as described above and scale bars shown in FIG. 2 indicate 10 μm. FIG. 3 is an SEM photograph showing PDO 3 line pattern formed as described above and a scale bar shown in FIG. 3 indicates 2.5 μm.

Example 2

Structural Control of Polymer Array Using Directional Photo-Fluidization

Radiating line-polarized light to the PDO 3 line pattern formed in Example 1, directional photo-fluidization was induced. Such line-polarized light was introduced in a direction parallel to a grating vector of a line type pattern. A light intensity of the introduced light was 35.5 mW/cm$^2$ while a wavelength thereof was 488 nm. A gap between initial PDO 3 lines was 2.45 μm. It was found that, as a radiation time is extended, photo-fluidization in a direction parallel to a light polarizing direction continues to cause decrease in gap of PDO 3 lines. After final radiation for 25 minutes, the gap was decreased to 230 nm. This is because PDO 3 line pattern is spreading in a polarizing direction of the emitted light. That is, PDO 3 caused photo-fluidization in a direction parallel to the polarizing direction of the light, thus spreading PDO 3 line pattern and, finally, decreasing the gap between PDO 3 lines. On the other hand, if line-polarized light having the same light intensity and wavelength as described above is radiated in a direction perpendicular to grating vector of a line type pattern, a gap between PDO 3 lines was not decreased. That is, directional photo-fluidization did not occur. Consequently, it is demonstrated that directional photo-fluidization is induced in a polarizing direction of emitted light.

Alternatively, radiating a holographic interference pattern to the PDO 3 line pattern formed in Example 1, directional photo-fluidization was partially induced. Two light beams having a direction parallel to grating vector of the PDO 3 line pattern were subjected to interference at a single position. For light interference, such two light beams were symmetrically emitted at an incident angle of 4°. In this case, a period of one-dimensional interference pattern was 3.49 μm while a light intensity of two light beams was 30.0 mW/cm$^2$. When radiating for 20 minutes, photo-fluidization occurred and was spread only in a relatively bright part of the one-dimensional interference pattern, along a polarizing direction of the emitted light. As a result, a barbell type PDO 3 pattern was obtained. Such photo-fluidization is expressed only on a bright part in a stream line form since a light intensity periodically alters in a stream line form within an interference pattern. When radiating the interference pattern for 60 minutes, PDO 3 is spreading by photo-fluidization on the bright part, in turn causing aggregation of PDO 3 lines at both sides. As a result, an ellipsoidal hole in a stream line shape is formed. Especially, since the interference pattern was periodically aligned, the ellipsoidal hole was also formed in a periodic arrangement.

Figure 4:
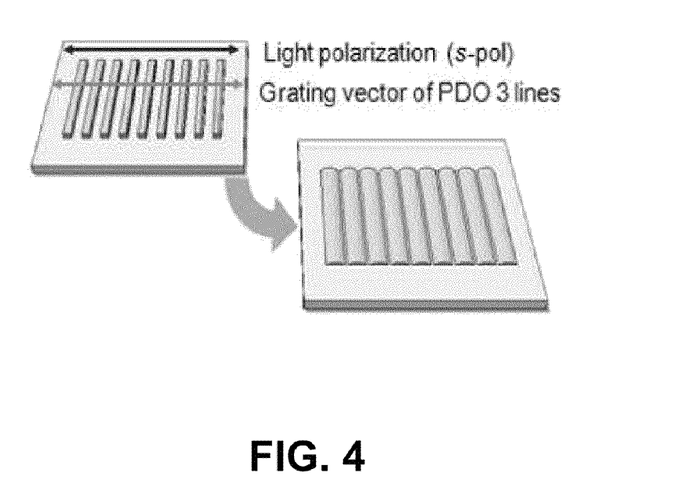
FIG. 4 schematically shows polarizing orientation of emitted light, a pattern of PDO 3 lines, a grating vector of PDO 3 line pattern and a pattern of modified PDO 3 lines formed by directional photo-fluidization.

FIG. 4 schematically shows polarizing orientation of emitted light, pattern of PDO 3 lines, grating vector of PDO 3 line pattern and pattern of modified PDO 3 lines by directional photo-fluidization.

Figure 5:
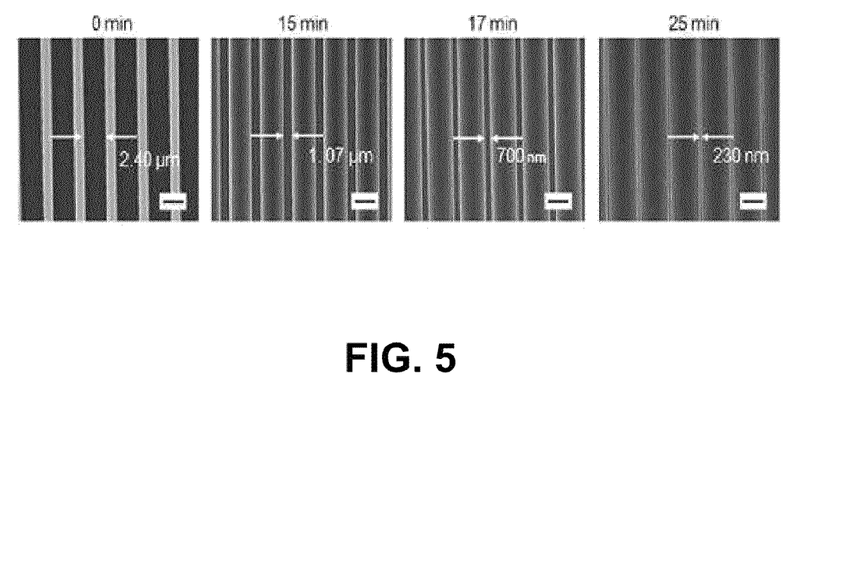
FIG. 5 is SEM photographs illustrating a pattern of PDO 3 lines modified by directional photo-fluidization over radiation time when polarized light is radiated in a direction parallel to a grating vector of a PDO 3 line pattern, wherein scale bars indicate 25 μm.

FIG. 5 is SEM photographs illustrating pattern of PDO 3 lines modified by directional photo-fluidization over radiation time when polarized light is radiated in a direction parallel to a grating vector of PDO 3 line pattern and scale bars shown in FIG. 5 indicate 25 μm.

Figure 6:
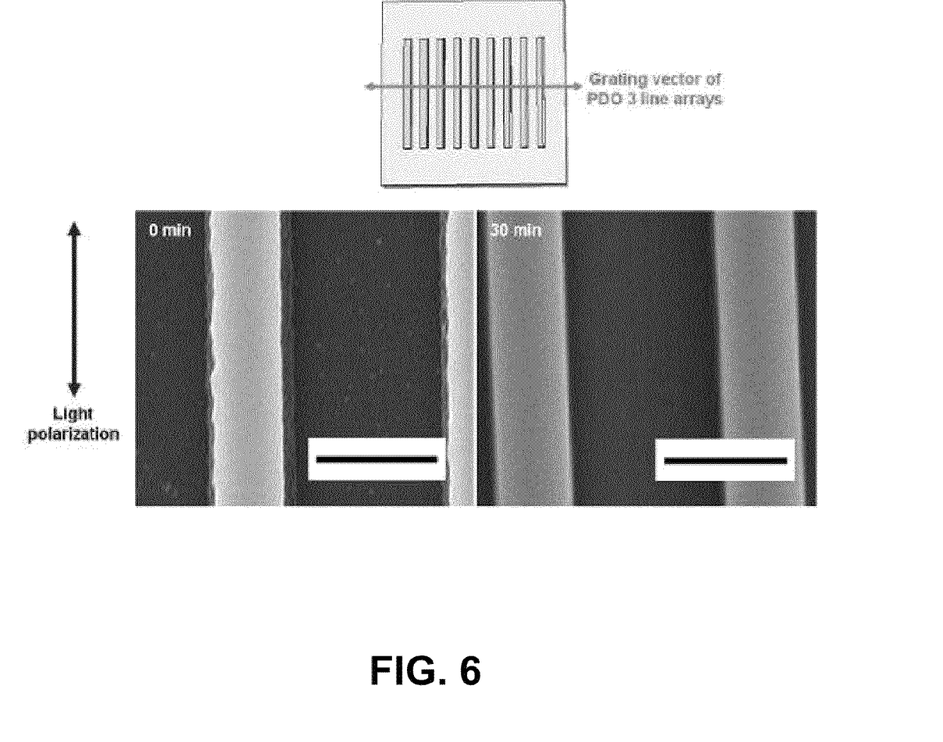
FIG. 6 is SEM photographs illustrating a specific pattern when polarized light is radiated for 30 minutes in a direction perpendicular to a grating vector of a PDO 3 line pattern.

FIG. 6 is SEM photographs illustrating a pattern when polarized light is radiated for 30 minutes in a direction perpendicular to a grating vector of PDO 3 line pattern.

Figure 7:
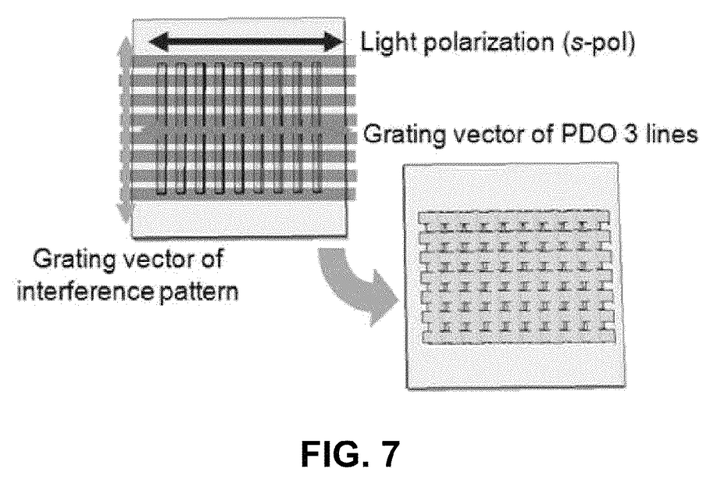
FIG. 7 schematically shows polarizing orientation of a one-dimensional interference pattern, a grating vector of the one-dimensional interference pattern, a grating vector of PDO 3 lines, and a pattern of modified PDO 3 lines formed by directional photo-fluidization induced using a one-dimensional pattern irradiation.

FIG. 7 schematically shows polarizing orientation of a one-dimensional interference pattern, a grating vector of the one-dimensional interference pattern, a grating vector of PDO 3 lines, and a pattern of modified PDO 3 lines by directional photo-fluidization induced using one-dimensional pattern irradiation.

Figure 8:
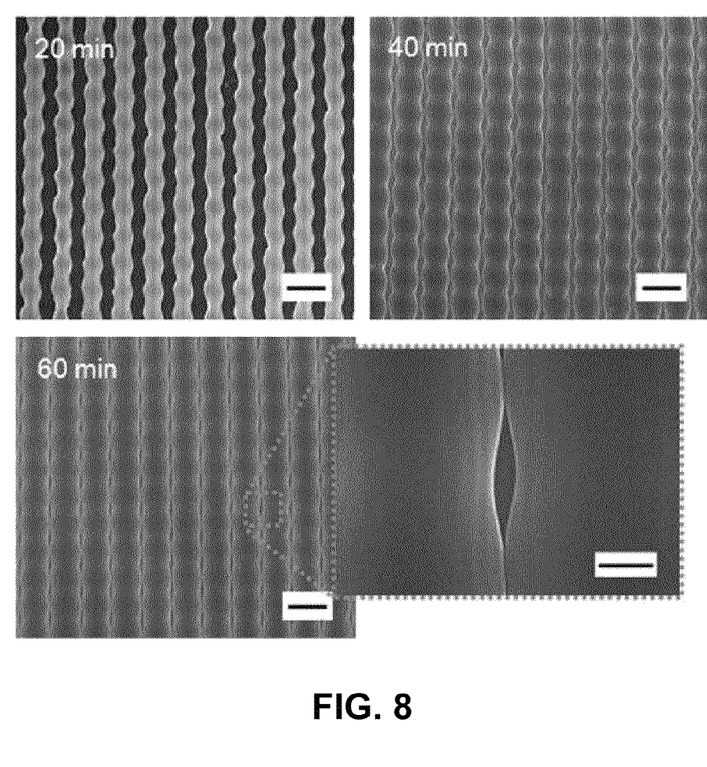
FIG. 8 is SEM photographs illustrating pattern of modified PDO 3 lines formed by partially directional photo-fluidization over time of one-dimensional interference pattern irradiation, wherein scale bars indicate 5 μm.

FIG. 8 is SEM photographs illustrating a pattern of modified PDO 3 lines formed by partially directional photo-fluidization over time of a one-dimensional interference pattern irradiation and scale bars shown in FIG. 8 indicate 5 μm.

Figure 9:
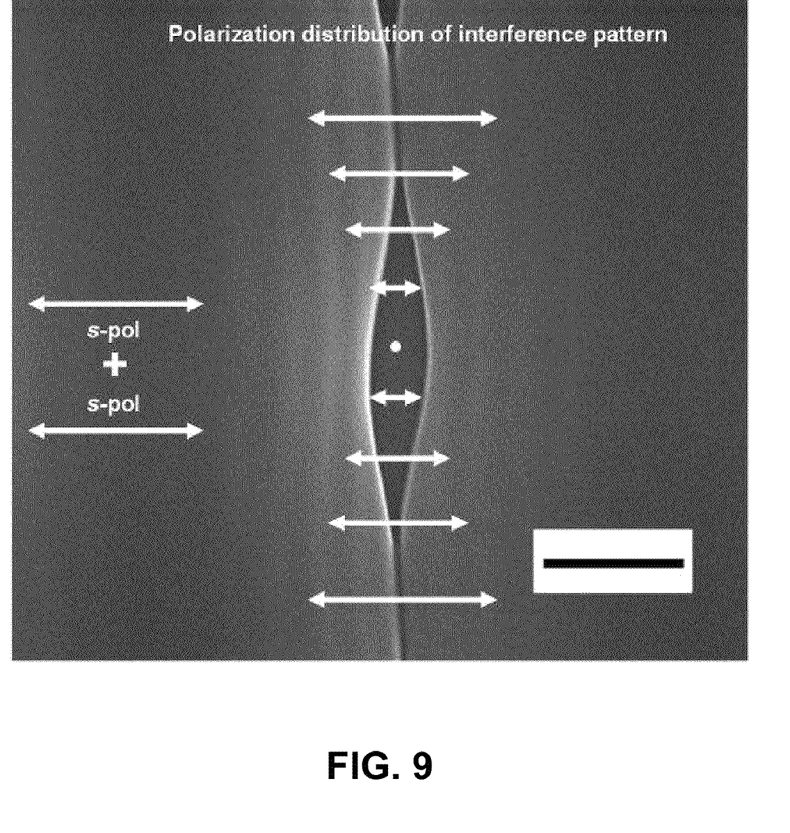
FIG. 9 shows change of light intensity in one-dimensional interference pattern wherein a length of arrow indicates light intensity and a scale bar indicates 5 μm.

FIG. 9 shows change of light intensity in a one-dimensional interference pattern wherein a length of arrow indicates light intensity and a scale bar shown in FIG. 9 indicates 5 μm.

Example 3

Transfer of Polymer Template Having Controlled Structure Using Directional Photo-Fluidization Occurred by Metal Application and Selective Polymer Removal Using the PDO 3 pattern formed in Example 2, which has a modified structure by directional photo-fluidization, pattern transfer was performed onto a micro-architectural array. Firstly, chromium was applied to a modified PDO 3 pattern to a thickness of 4 nm by electron-beam evaporation, followed by application of gold thereon to a thickness of 40 nm. Chromium was introduced to improve bonding properties of gold to a quartz substrate. Next, in order to remove the modified PDO 3 pattern having gold coated thereon, the substrate was immersed in an acetone solvent for 1 minute and immediately placed in a methyl pyrrolidone solvent for 5 minutes. By such solvent treatment twice, PDO 3 was completely eliminated. As a result, a gold line pattern was obtained from the modified PDO 3 pattern and a width of such gold line pattern was substantially identical to a gap between the modified PDO 3 line patterns. Likewise, using a one-dimensional interference pattern, the modified PDO 3 ellipsoidal pattern was also transferred into a gold ellipsoidal pattern. Here, a size of the transferred gold ellipsoidal pattern was substantially identical to that of the PDO 3 ellipsoid. It was found that the size of the gold ellipsoid is decreased over time for irradiation of one-dimensional interference pattern. This result is obtained because directional photo-fluidization develops while the size of PDO 3 ellipsoidal hole is reduced when the irradiation time is increased.

Figure 10:
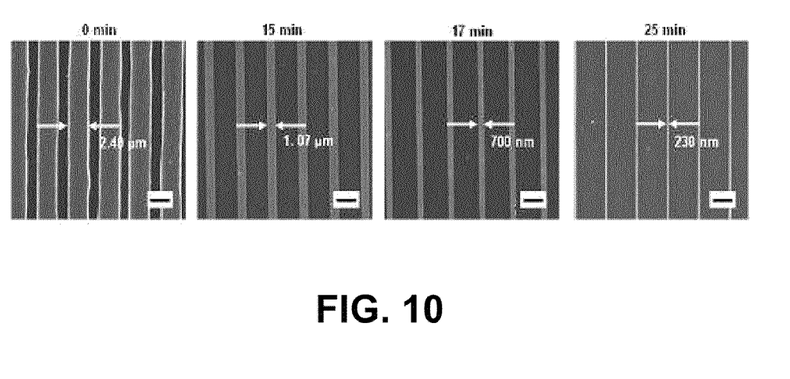
FIG. 10 is SEM photographs illustrating pattern of gold lines transferred from a modified PDO 3 line pattern over light radiation time, wherein scale bars indicate 25 μm.

FIG. 10 is SEM photographs illustrating a pattern of gold lines transferred from a modified PDO 3 line pattern over light radiation time and scale bars shown in FIG. 10 indicate 25 μm.

Figure 11:
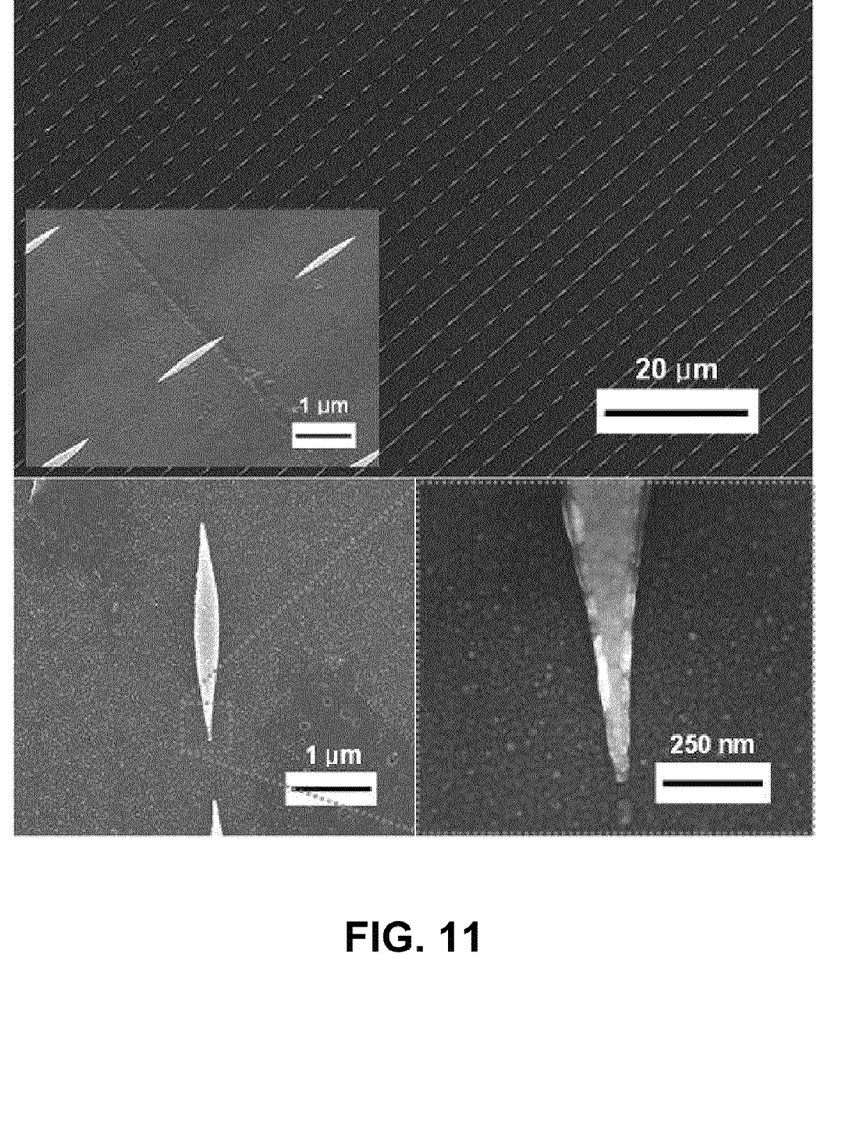
FIG. 11 is SEM photographs illustrating a gold ellipsoidal pattern transferred from modified PDO 3 ellipsoidal pattern by a one-dimensional interference pattern irradiation.

FIG. 11 is SEM photographs illustrating a gold ellipsoidal pattern transferred from a modified PDO 3 ellipsoidal pattern by one-dimensional interference pattern irradiation.

Figure 12:
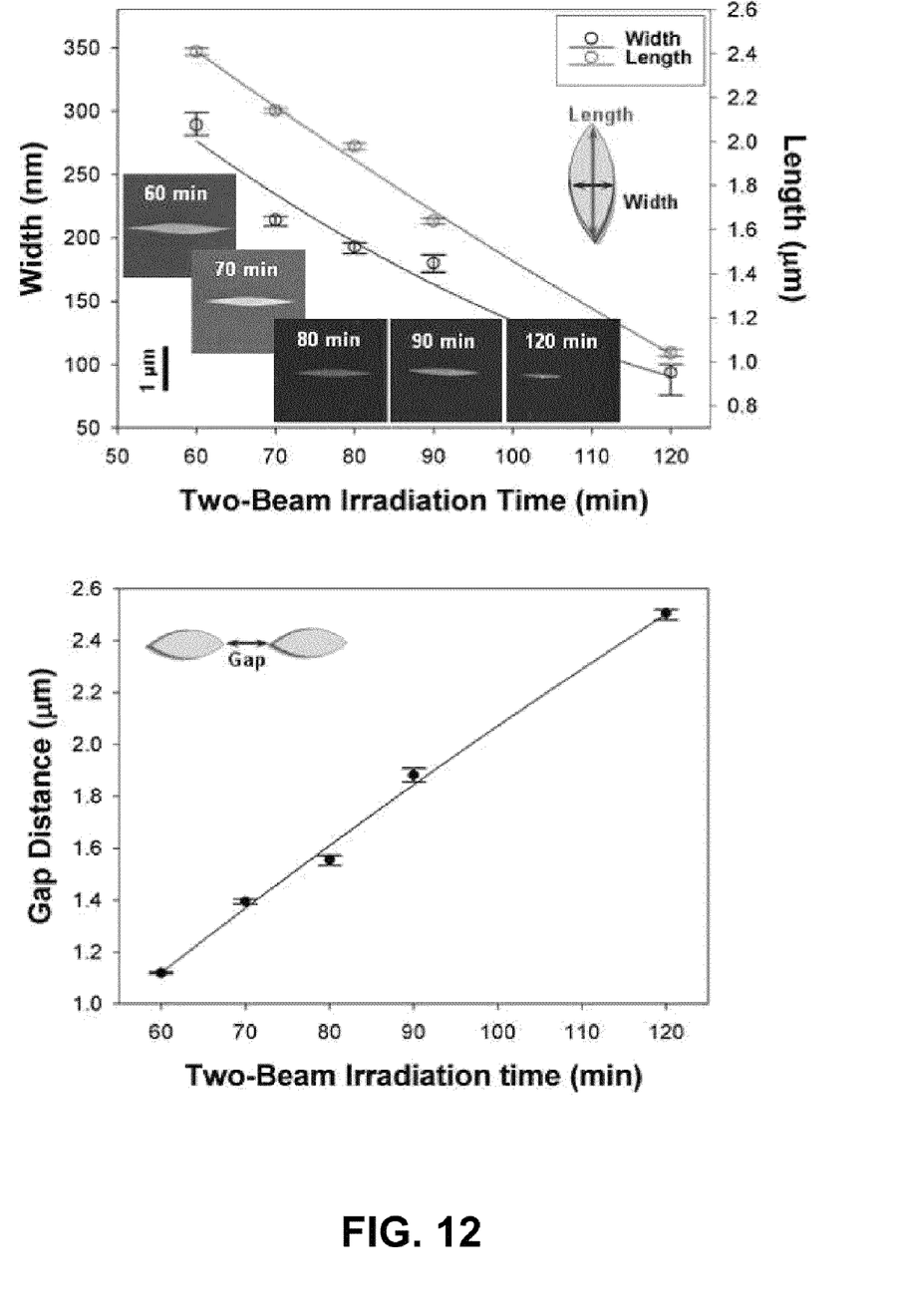
FIG. 12 is SEM photographs illustrating a gold ellipsoidal pattern transferred from a modified PDO 3 ellipsoidal pattern over time of one-dimensional interference pattern irradiation, and a size graph of the pattern.

FIG. 12 is SEM photographs illustrating a gold ellipsoidal pattern transferred from a modified PDO 3 ellipsoidal pattern over time of one-dimensional interference pattern irradiation, and a size graph of the pattern.

Example 4

Examination of Light Wave Amplification of Gold Ellipsoid

For the gold ellipsoidal array fabricated in Example 3, light wave amplification was evaluated. First, light emitted from a halogen lamp was radiated onto the gold ellipsoid. Here, an intensity of the emitted light was 100 W/cm$^2$ and an incident angle thereof was 60°. Next, light amplified and scattered from the gold ellipsoid was transmitted to a spectrometer in order to detect a wavelength area at which the light is amplified. In this case, among the light amplified and scattered from the gold ellipsoid, particularly polarized light in a short axis direction of the gold ellipsoid was selectively isolated using a polarizer in the foregoing short axis direction, followed by analysis of the same. As a result of the analysis, it was found that the isolated light is amplified and scattered within a wavelength range of 600 to 1,150 nm on the basis of size of the gold ellipsoid.

Figure 13:
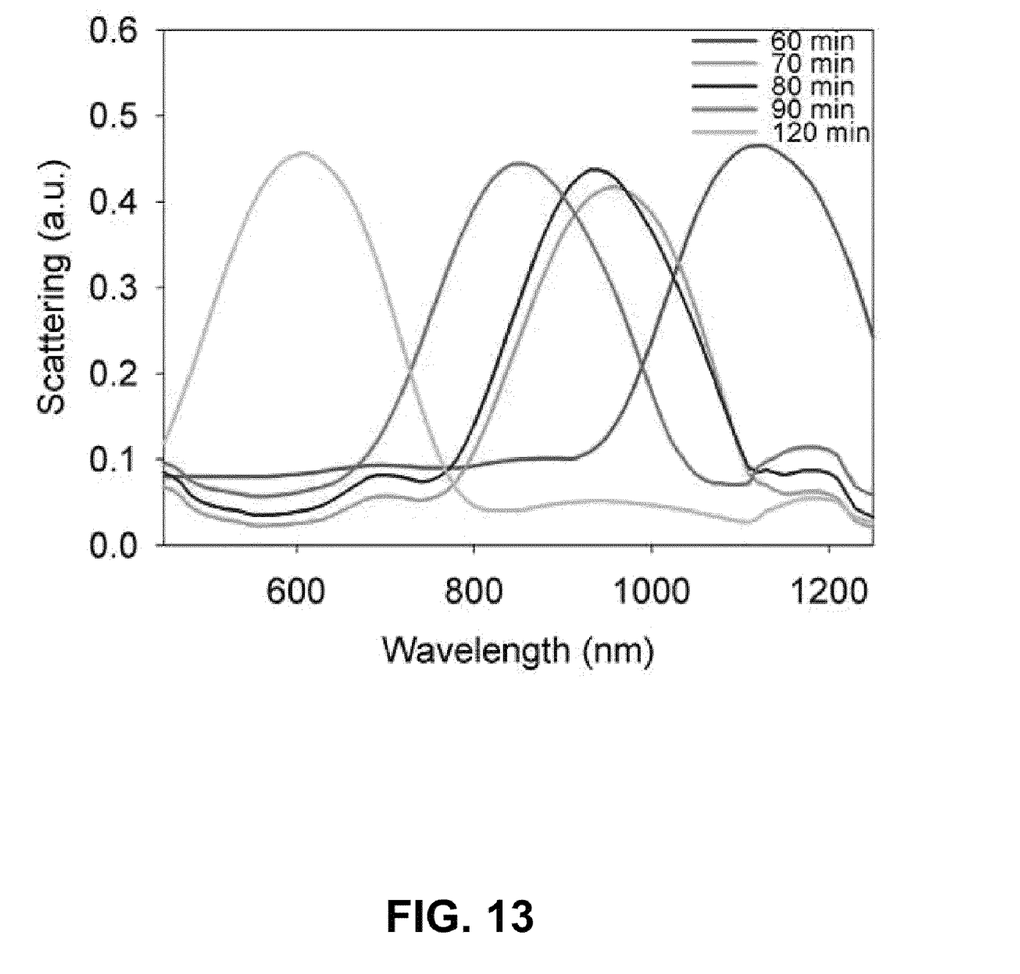
FIG. 13 is a graph of scattering wave and amplified wave of light polarized in a short axis of a gold ellipsoid among scattering and amplified lights from gold ellipsoids with different sizes.

FIG. 13 shows graphs of a scattering wave and an amplified wave of the light polarized in a short axis of gold ellipsoid among scattering and amplified lights from gold ellipsoids with different sizes.

As such, the present invention using a polymer array having directional photo-fluidization properties may efficiently and precisely control morphology and size of a micro-architecture. Since controlling the morphology and size of the micro-architecture is performed in a large scale and parallel process, the present invention is suitable for mass production of micro-architectures. Moreover, the micro-architecture having precisely controlled morphology and size may enable precision control of nano-optical properties such as plasmonic action, thereby being used as a micro-optical device in various applications.

While the present invention has been described with reference to the preferred embodiments, it will be understood by those skilled in the related art that various modifications and variations may be made therein without departing from the scope of the present invention as defined by the appended claims.

What is claimed is:

1. A method for fabrication of a patterned micro-architectural array by a directional photo-fluidization of a polymer, which includes a process for formation of a micro-architectural array, the method comprising:

preparing a micro-fluidic device by bonding a rubber mold having a micro-pattern to a substrate;

introducing a polymer solution to the micro-fluidic device;

drying the polymer to form a polymer line array corresponding to a pattern of a micro-fluidic tube;

inducing directional photo-fluidization by light radiation to control shape and size of the micro-architecture array; and applying metal to the polymer array having controlled structure by directional photo-fluidization then selectively removing the polymer, in order to enable transfer of the shape of the polymer onto the micro-architectural array.

2. The method according to claim 1, wherein the polymer is a polymer having an azo-benzene molecule-containing linear structure, a composition including the polymer or a derivative of the polymer.

3. The method according to claim 1, wherein the array is a linear or ellipsoidal array pattern formed by directional fluidization of the polymer.

4. The method according to claim 1, wherein orientation and extent of the directional fluidization are controlled using a polarizing direction and a light radiation time.

5. The method according to claim 1, wherein the directional fluidization of the polymer is partially induced by irradiation of a one-dimensional holographic interference pattern and used to form an ellipsoidal array pattern.

6. The method according to claim 1, wherein metal is applied to the polymer using the polymer linear pattern array that has a controlled structure formed by the directional fluidization and the polymer is selectively removed to enable pattern transfer onto a micro-architecture.

7. The method according to claim 1, wherein metal is applied to the polymer using the polymer ellipsodial pattern array that has a controlled structure formed by the directional fluidization and the polymer is selectively removed to enable pattern transfer onto a micro-architecture.

* * * * *